United States Patent [19]

Avaneas

[11] Patent Number: 5,132,975
[45] Date of Patent: Jul. 21, 1992

[54] VERY HIGH SPEED ERROR DETECTION NETWORK

[75] Inventor: Napolean G. Avaneas, Kings Park, N.Y.

[73] Assignee: Grumman Aerospace Corporation, Bethpage, N.Y.

[21] Appl. No.: 734,045

[22] Filed: Jul. 22, 1991

Related U.S. Application Data

[63] Continuation of Ser. No. 311,695, Feb. 16, 1989, abandoned.

[51] Int. Cl.⁵ .............................................. G06F 11/10
[52] U.S. Cl. ................................................... 371/37.6
[58] Field of Search ................... 371/37.6, 37.1, 38.1, 371/39.1

[56] References Cited

U.S. PATENT DOCUMENTS

| | | | |
|---|---|---|---|
| 3,452,328 | 6/1969 | Hsiao | 371/37.6 |
| 3,474,413 | 10/1969 | Dryden | 371/37.6 |
| 3,601,800 | 8/1971 | Lee | 371/37.6 |
| 3,798,597 | 3/1974 | Frambs | 371/37.1 |
| 4,312,068 | 1/1982 | Goss | 371/37.6 |
| 4,397,020 | 8/1983 | Howson | 371/37.1 X |
| 4,450,561 | 5/1984 | Gotze | 371/37.6 |
| 4,498,174 | 2/1985 | LeGresley | 371/37.6 |
| 4,593,393 | 6/1986 | Mead | 371/37.6 |
| 4,809,273 | 2/1989 | Jackowski | 371/37.1 X |

OTHER PUBLICATIONS

Computer Networks by Andrew S. Tanenbaum, Published Prentice-Hall, Inc. Englewood Cliffs, N.J. 07632 pp. 122–133.

Fairchild Camara and Instrumentation Corporation, Gate Array Division 1801 McCarthy Blvd., Milpitas, Calif. 95935, p. 10.

Proceedings of the IEEE 1986 National Aerospace and Electronics Conference, May 19–23, 1986, "A 100 Megabits per Second Advanced Data Bus System" by Dr. Napoleon G. Avaneas, pp. 93–99.

Fairchild Camera and Instrument Corp. Digital Products Division, 333 Western Avenue, South Portland, Me. 04106, A Division of National Semiconductors, Corporation, pp. 271–284.

Primary Examiner—Robert W. Beausoliel
Attorney, Agent, or Firm—Scully, Scott, Murphy & Presser

[57] ABSTRACT

A very high speed cyclic redundancy code (CRC) generator/tester used to implement a CRC polynomial for purposes of detecting errors in telecommunications data. A given n-bit word message to be transmitted over some medium is first processed by the very high speed CRC generator/tester in order to generate, in parallel format, a cyclic redundancey code word to be attached to the message. The n-bit word message plus cyclic redundancy code word is then processed, in a manner identical to processing at the transmitter, at the receiver in order to establish if a transmission error has occurred. The parallel processing offered by this very high speed CRC generator/tester allows for much greater processing speeds than the prior art.

52 Claims, 3 Drawing Sheets

VERY HIGH SPEED ERROR DETECTION NETWORK

This application is a continuation of application Ser. No. 311,695, filed on Feb. 16, 1989 now abandoned.

BACKGROUND OF THE INVENTION

1. Field of the Invention

The present invention relates to systems for the high speed generation and detection of error checking sequences for use in the transmission of telecommunications data. More particularly, the invention relates to a system for generating a cyclic redundancy code word which is appendend to the end of a transmitted message thus forming a frame check sequence to be transmitted. The frame check sequence is verified at the receiver to determine if any errors have occured in the transmission process.

2. Discussion of the Prior Art

Frame check sequence generators and frame check sequence testers are used to implement cyclic redundancy codes (CRC) for the purpose of detecting errors in telecommunications data. Advances in technology, especially in the digital telecommunications area, has created a need for exchanging large volumes of data at an ever increasing rate. This situation has created a need for faster frame check sequence generators and frame check sequence testers.

There are numerous examples of CRC generator/testers available in medium scale integrated (MSI) circuit packages in a variety of technologies. These CRC generator/testers are capable of implementing any of the standard CRC polynomials. The basic operation of these devices includes dividing the input data or message by one of the standard CRC polynomials and appending the resulting remainder to the message as check bits. At the receiver, the message plus check bits are divided by the same polynomial. If no error exists, the division results in a zero remainder.

The prior art frame check sequence generator/testers use a combination of shift registers and discrete combinational logic gates. The difficulty, especially at high data rates, with these types of circuits is that they require an amount of processing time, at a minimum, equal to a bit duration for each transmitted bit which often causes extensive delays in transmitting large amounts of data. The time delay is present because each bit is shifted serially into the CRC generator/tester at the same time that the data is being transmitted on the interconnecting medium. The same delay exists at the receiver because similar processing is necessary on the received data as was performed on the input data to generate the transmitted CRC.

SUMMARY OF THE INVENTION

It is therefore an object of the present invention to provide a very high speed error detection network which significantly increases the rate of generation and detection of a frame check sequence to determine errors occurring in the transmission of telecommunications data.

It is still a further object of the present invention to provide a very high speed error detection network in which a cyclic redundancy code word is generated in parallel format whereby each bit of the cyclic redundancy code word is calculated simultaneously to increase the speed of generation and detection.

It is a further object of the present invention to provide a very high speed frame check sequence generator which calculates the cyclic redundancy code word in parallel format whereby each bit of the cyclic redundancy code word is calculated simultaneously from the input message.

It is also an object of the present invention to provide a very high speed frame check sequence detector which calculates a cyclic redundancy code word in parallel format from incoming transmitted data, whereby each bit of the cyclic redundancy code word is calculated simultaneously, and where the cyclic redundancy code word calculated by the detector is compared with a cyclic redundancy code word transmitted with the transmitted data to determine if an error has occurred in transmission.

The present invention provides a network for the very high speed detection of errors transmitted in telecommunications data that avoids the deficiencies of the prior art by exploiting the advantages of parallel processing. The present invention generates a cyclic redundancy code word in parallel format through combinational logic, available in a single gate array, for each CRC bit simultaneously, instead of serially. By incorporating the parallel processing of each CRC bit simultaneously, and by using combinational logic circuit gate arrays, the rate at which data can be transmitted and checked for accuracy can increase by a factor "N" where N is the degree of the CRC word, thereby providing real time error detection. In addition, the present invention can also implement any of the standard CRC polynomials or non-standard polynomials by simple modification of the CRC polynomial generating program.

The frame check sequence of the present invention comprises a cyclic redundancy code word of N-bits in length appended to the end of a given K-bit message. The CRC word is calculated in a combinational logic circuit (CLC) in which input data is fed to the CLC in N-bit words, along with a preselected N-bit initialization word on the first iteration. The data and initialization word are fed to the CLC in parallel format by means of a parallel data bus, and the calculation is a numerical division process whereby the data and initialization word are divided by a preselected CRC polynomial using a set of predetermined carry look-ahead equations which implement the cyclic redundancy code polynomial. On subsequent CLC calculations, input data and the previous remainder are fed into the CLC. The cyclic nature of the CRC word calculation is referred to as the cyclic redundancy code generation sequence. The speed of calculation is greatly increased since each bit of the CRC word is calculated simultaneously in a parallel format.

The network of the present invention is comprised of a transmitter and a receiver which are interconnected by a data bus or communication channel. The transmitter includes a shift register which stores data in parallel and shifts it in serial format to the network interconnecting bus. At the same time, the parallel input data is sent to a parallel-to-parallel shift register to be stored and shifted in N-bit words to the CLC for calculation of the CRC word. The CLC receives the input data in N-bit words along with a preselected N-bit initialization word initially, and the previous remainder subsequently, in parallel format. The CRC word is calculated from these two sources in a numerical division process whereby the input data and initialization word or previous remainder are divided by the CRC polynomial using a set of predetermined carry look-ahead equations which implement the cyclic redundancy code word polynomial. Each bit of the CRC word is calculated simultaneously in parallel format whereby the CRC word is the remainder of the numerical division process. When the calculation is complete, the CRC word is shifted out of the CLC in serial format, and is appended to the data message as an N-bit word at the end of the message forming a frame check sequence.

At the receiver, a plurality of shift registers are provided, including a serial-to-parallel shift register which converts the transmitted data or frame check sequence back to parallel format. The frame check sequence, including the N-bit CRC word, is sent in N-bit words along the interconnecting channels to be read while simultaneously being sent to the CRC generator/tester network of the receiver. This received data is now divided using the same carry look-ahead equations implementing the same predetermined polynomial as was done at the transmitter. If no error in transmission has occurred, then the final remainder will be zero. If an error in transmission has occurred, including an error in the CRC word as well as in the message data, then the remainder will be non-zero indicating an error.

BRIEF DESCRIPTION OF THE DRAWINGS

The foregoing objects and other features of the invention will become more readily apparent and may be understood by referring to the following detailed description of an illustrative embodiment of the high speed error detection network, taken in conjunction with the accompanying drawings, in which.

DETAILED DESCRIPTION OF THE PREFERRED EMBODIMENT

The very high speed error detection network of the present invention provides for the detection of errors in transmitted telecommunications data. The network is divided into a transmitter section and a receiver section, each comprising identical frame check sequence generators/testers. The frame check sequence generator/testers are used to implement a cyclic redundancy code for the purpose of detecting the aforementioned errors. In the transmitter, parallel data is provided to a parallel-to-serial shift register, and a parallel-to-parallel shift register. Data from the parallel-to-parallel shift register is fed into a combinational logic circuit which is programmed to implement a predetermined cyclic redundancy code polynomial, which in turn feeds the calculated cyclic redundancy code word to a second parallel-to-parallel shift register which stores the intermediate and final results of the cyclic redundancy code word computation. When all data has been transmitted out, and the final cyclic redundancy code word calculated, both are shifted out serially onto the interconnecting medium. In the receiver, in an almost similar process, serial data enters a serial-to-parallel shift register. The parallel data is then sent to an identical set of cyclic redundancy code word generator/tester circuitry where a second cyclic redundancy code word is generated. If the transmitted cyclic redundancy code word is identical to the one calculated at the receiver, then the transmitted data is correct, otherwise, there is a need to retransmit. The process of generating the CRC is the CRC sequence, which is basically a cyclic division process which requires the implementation of the set of carry look-ahead equation which are generated to implement the selected cyclic redundancy code word polynomial.

The very high speed error detection network is particularly useful in larger communication systems such as the one disclosed by U.S. Pat. No. 4,827,477, issued May 2, 1989, the disclosure of which is incorporated herein by reference thereto. The above referenced application discloses a bus interface unit for interfacing a host computer to a high speed Local Area Network. The bus interface unit is part of the apparatus called a port which is the device connecting a data bus and a host computer. A frame check sequence generator/tester is used by the bus interface unit to determine the validity of all transmitted data.

Figure 1:
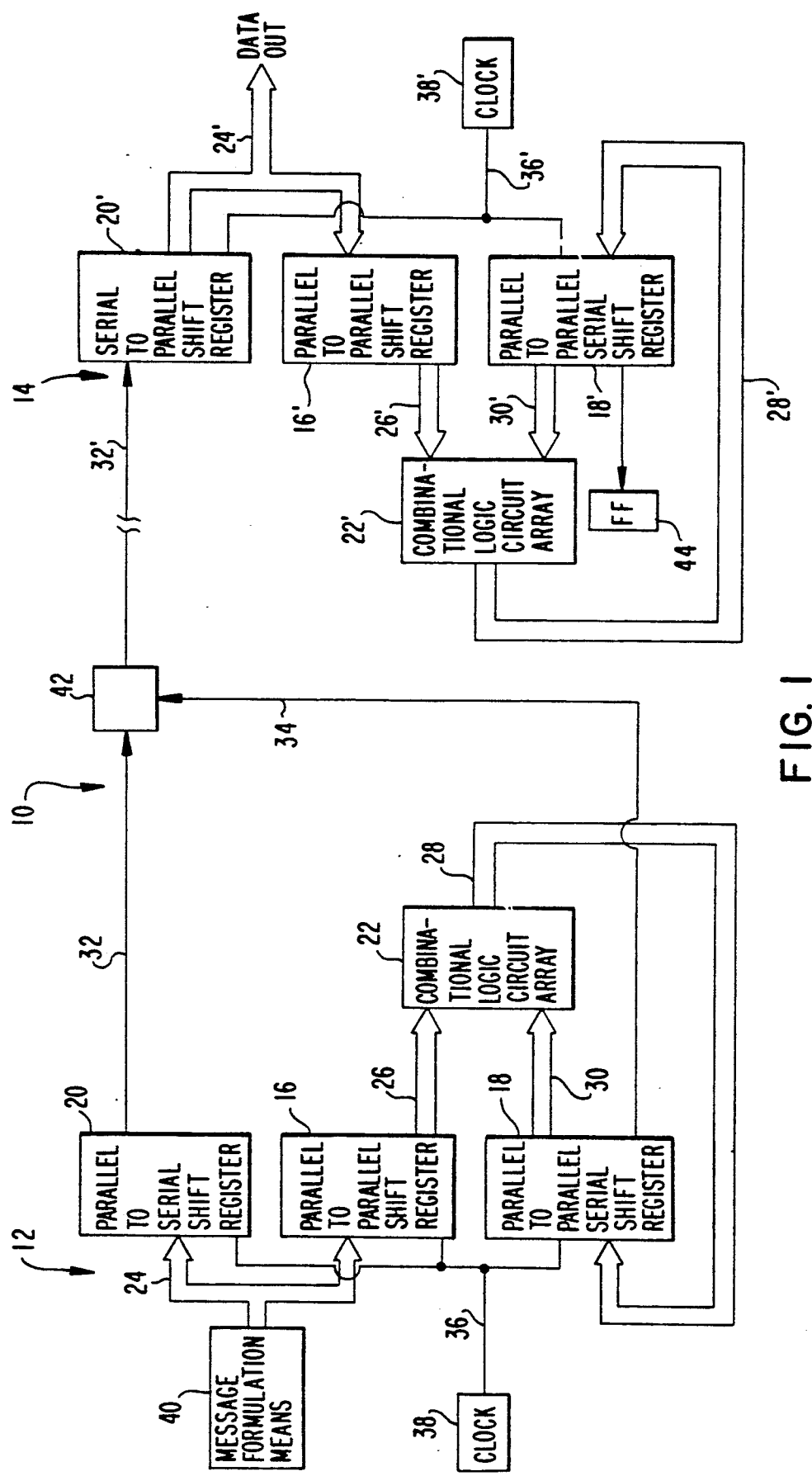
FIG. 1 is a block diagram representation of a transmitter/receiver employing a very high speed CRC generator/tester.

Referring now in specific detail to the drawings, FIG. 1 shows a high speed parallel format error detection network 10 including a transmitter 12, and a receiver 14. The error detection network 10 is a cyclic redundancy code (CRC) generator/tester used for detecting errors in telecommunications data.

Referring now to the transmitter portion 12 of the high speed CRC generator/tester network 10, FIG. 1 shows the transmitter 12 having two parallel-to-parallel shift registers 16 and 18 and one parallel-to-serial shift register 20. These shift registers are standard medium scale integrated circuits (MSI) and are available in a variety of technologies such as transistor-transistor logic (TTL) or complementary metal oxide semiconductor (CMOS) logic. The specific technology chosen should be based on requirements such as speed and/or compatibility with peripheral devices. The transmitter 12 also includes a combinational logic circuit (CLC) 22, which comprises a particular arrangement of logic gates in one gate array which can be programmed to implement multiple logic equations. The CLC 22 is available in a variety of technologies such as a programmable logic array (PLA) or emitter-coupled logic (ECL), and the choice of technology is based upon application preferences. The preferred technology in this embodiment of the invention is ECL.

The shift registers 16 and 20 are connected to a message generation means 40 by a parallel format data bus 24. Shift register 16 is connected to the combinational logic circuit 22 via parallel format data bus 26. The combinational logic circuit 22 and shift register 18 are interconnected by parallel data buses 28 and 30 respectively. The aforementioned data buses are used for transferring data between the various integrated circuits. Serial data line 32 and serial data line 34 connect register 20 and register 18 to selection control device 42 respectively. The two serial data lines 32 and 34 are used as a means for the serial transmission of the message and the cyclic redundancy code word, which is appended to the end of the data transmission, respectively. This will hereinafter be discussed in detail. It should be noted that these data lines 32 and 34 do not have to be serial lines, they can be parallel lines as well. Serial transmission lines are more common and therefore, the preferred embodiment of the invention makes use of serial data lines. The data lines are common devices used widely throughout the art. A timing clock 38 is connected to shift registers 16, 18 and 20 by timing signal line 36. The clock 38 generates a pulse that provides the timing requirements necessary to ensure proper data handling to and from the registers and to and from the CLC 22. The timing involved shall become clear in the detailed description of the operation of the invention.

In operation, a message is formulated into N-bit words at the message generation means 40. For purposes of this example the message word length is 16 bits. The message generation means 40 may be a keyboard and computer, or any other known means for generating data in the form of bit words. Once the message word length is chosen, then an appropriate CRC polynomial is chosen in order to produce a CRC word of the same length as the message word length in order to preserve accuracy. The message or data of N 16-bit words enters the very high speed CRC generator/tester 20 via the parallel format data bus 24. A first clock pulse from clock 38 causes the first 16-bit data word to be shifted in parallel format from generation means 40 into registers 16 and 20. After the first data word enters registers 16 and 20, the next clock pulse from clock 38 causes the next data word in generation means 40 to enter registers 16 and 20 and at the same time causes register 16 to shift the first data word, in parallel format, to the CLC 22 and register 20 to serially shift the first data word onto the transmission line 32.

The CLC 22 has been pre-programmed to logically implement a set of equations generated by a program outlined in the flow chart shown in FIG. 2 as will be hereinafter described in detail. The combinational logic circuit array 22 implements the equations for all 16 bits of the cyclic redundancy code word. The equations programmed into the CLC 22 perform a 16-bit division in parallel format of the message word by a selected CRC polynomial. The result of this division is a 16-bit remainder of the division which is commonly referred to as an intermediate 16-bit cyclic redundancy code word. This remainder is shifted from CLC 22 into register 18 in parallel format via the parallel data bus 28 on the next clock pulse from clock 38. At the same time the remainder is being shifted into register 18 from the CLC 22, the next data word is being shifted into registers 16 and 20 and the data already stored in register 16 is being shifted into the CLC 22 while the data stored in register 20 is being shifted onto the transmission line 32. In any continuing division operation it is necessary to add the remainder back into the remaining dividend in order to complete the division. Therefore, on the next clock pulse, the remainder stored in register 18 is shifted into the CLC 22 via data bus 30 where the next division occurs. This process of shifting the remainder back into the remaining dividend continues for a predetermined number of shifts which corresponds to the number of incoming data words. By having the remainder stored in register 18 shifted into CLC 22 on the same clock pulse as the next data word from register 16 is being shifted into CLC 22 allows for the cyclic redundancy code bits to be generated in a single step. The equations implemented by the CLC 22 make it possible to handle the division in this manner. The operation is cyclic and continues until the last message word enters registers 16 and 20. When the message is complete and the final division occurs, the final remainder stored in register 18 is shifted out in serial format via data line 34. This final remainder is appended to the end of the transmitted message for transmission over the interconnecting transmission medium, which may be optical cable or standard electrical transmission lines, to the receiver. The combination of the transmitted message and appended cyclic redundancy code word form a frame check sequence. The data that has previously been shifted onto transmission line 32 has been stored at selection control device 42 while the cyclic redundancy code word is being generated. The selection control device 42 is a switching device that allows the cyclic redundancy code word to be appended to the end of the given message based on some type of signal or flag as disclosed in U.S. Pat. No. 4,827,477 issued May 2, 1989, and assigned to the same assignee as the present invention.

It is important to note that the very high speed error detection network of the present invention is not a stand alone device, but rather, it is part of a larger communication network that is usually controlled by a host microprocessor. The host microprocessor is responsible for configuring the error detection network in order to establish proper operating conditions. Basically, the host microprocessor provides control signals or flags to indicate such parameters as the number of words in a particular message, start of message and end of message which are used by the error detection network to control the flow of data through its own circuitry. U.S. Pat. No. 4,827,477 issued May 2, 1989, and assigned to the same assignee as the present invention discloses such an operating environment and describes the various control flags used to manipulate the data flow through such an error detection network.

Referring now to the receiver 14 of the communication network 10, it should be noted that the receiver is similar in function as well as in structure to that of the transmitter 12 and like elements have been denoted with like numerals with the addition of a prime. The received data or message plus the 16-bit cyclic redundancy code word is processed in an identical manner as the message entering the transmitter 12. One structural difference between transmitter and receiver is that data entering the receiver 14 on data line 32' is in serial format, thus it must be converted into parallel format before entering the CRC network. Register 20' is a serial-to-parallel shift register that converts the incoming data into proper format for processing, as well as providing a buffer for the decoding and further use of the message. The only difference in function between the operation of the receiver and transmitter portions of the CRC generator/tester network is that the network at the receiver 14 must perform one additional division in order to accommodate the additional 16 bits of the cyclic redundancy code word. If the data was transmitted without corruption, then the result of the divisions by the carry look-ahead equations, identical to one at transmitter, shall result in the same remainders as the ones calculated at the transmitter 12; therefore, the additional final division at the receiver 14, should have no remainder thus indicating that no transmission error has occurred. If the remainder of the final division is anything other than zero, a transmission error has occurred. If a transmission error has occurred, then a flip-flop 44 is set in order to indicate that the data is in error, and there is a need for a retransmission.

The message and appended cyclic redundancy code word which forms the frame check sequence enters register 20' from transmission line 32' on the first clock pulse provided by clock 38'. After the first data word enters register 20', the next clock pulse from clock 38' causes the next data word from transmission line 32' to enter register 20' and at the same time causes register 16' to receive the first data word, in parallel format, and register 20' to shift in parallel format the first data word into a decoding means (not shown) via bus 24'. On the next clock pulse from clock 38', the next data word from transmission line 32' enters register 20' and at the same time causes register 16' to shift the first data word, in parallel format, to the CLC 22'. As stated previously, the CLC 22' has been pre-programmed to logically implement the set of carry look-ahead equations generated by the program outlined in the flow chart shown in FIG. 2. The combinational logic circuit array 22' implements the equations for all 16 bits of the cyclic redundancy code word. The equations programmed into the CLC 22' are generated to perform a 16-bit division in parallel format of the message word by the CRC polynomial. The result of this division is a 16-bit remainder of the division which is commonly referred to as an intermediate 16-bit cyclic redundancy code word. This remainder is shifted from CLC 22' into register 18' in parallel format via the parallel data bus 28' on the next clock pulse from clock 38'. At the same time the remainder is being shifted into register 18' from the CLC 22', the next data word is being shifted into register 20' and the data already stored in register 16' is being shifted into the CLC 22' while the data stored in register 20' is being shifted into the decoding means. In any continuing division operation it is necessary to add the remainder back into the remaining dividend in order to complete the division. Therefore, on the next clock pulse, the remainder stored in register 18' is shifted into the CLC 22' via data bus 30' where the next division occurs. As stated previously, the process of shifting the remainder back into the remaining dividend continues for a predetermined number of shifts which corresponds to the number or incoming words. By having the remainder stored in register 18' shifted into CLC 22' on the same clock pulse as the next data word from register 16' is being shifted into CLC 22' allows for cyclic redundancy code bit generation in a single step. The equations implemented by the CLC 22' make it possible to handle the division in this manner. The operation is cyclic and continues until the last word of the frame check sequence, generated at the transmitter 12, enters registers 20'. When the message is complete and the final division occurs, the final remainder stored in register 18' is shifted into flip-flop 44, where if it is anything but logic 0, the flip-flop is set which indicates an error in transmission has occurred.

In order to better understand the concept of the extra division that occurs at the receiver 14 of the network 10, a simple example is given. If the message entering the transmitter 12 is 20 words of 16 bits each, then the receiver 14 will receive a total of 21 words of 16 bits each. This is due to the final remainder being appended to the end of the transmitted 20 word message. The receiver 14 now performs identical logic divisions as were done on the 20 words at the transmitter 12. The division of the first 20 words will result in a remainder and if the transmission of the 20 words were uncorrupted, then the remainder generated at the receiver 14 will be identical to the remainder generated at the transmitter 12. However, since 21 words have been transmitted, and an end of transmission flag has not been received, the receiver 14 performs an extra division. As stated earlier, if the 20 words of the message were not corrupted, then the last word to be generated by the CLC 22' shall be identical to the remainder already stored in register 16' and thus resulting in no remainder from the final CLC 22' calculation.

Figure 2:
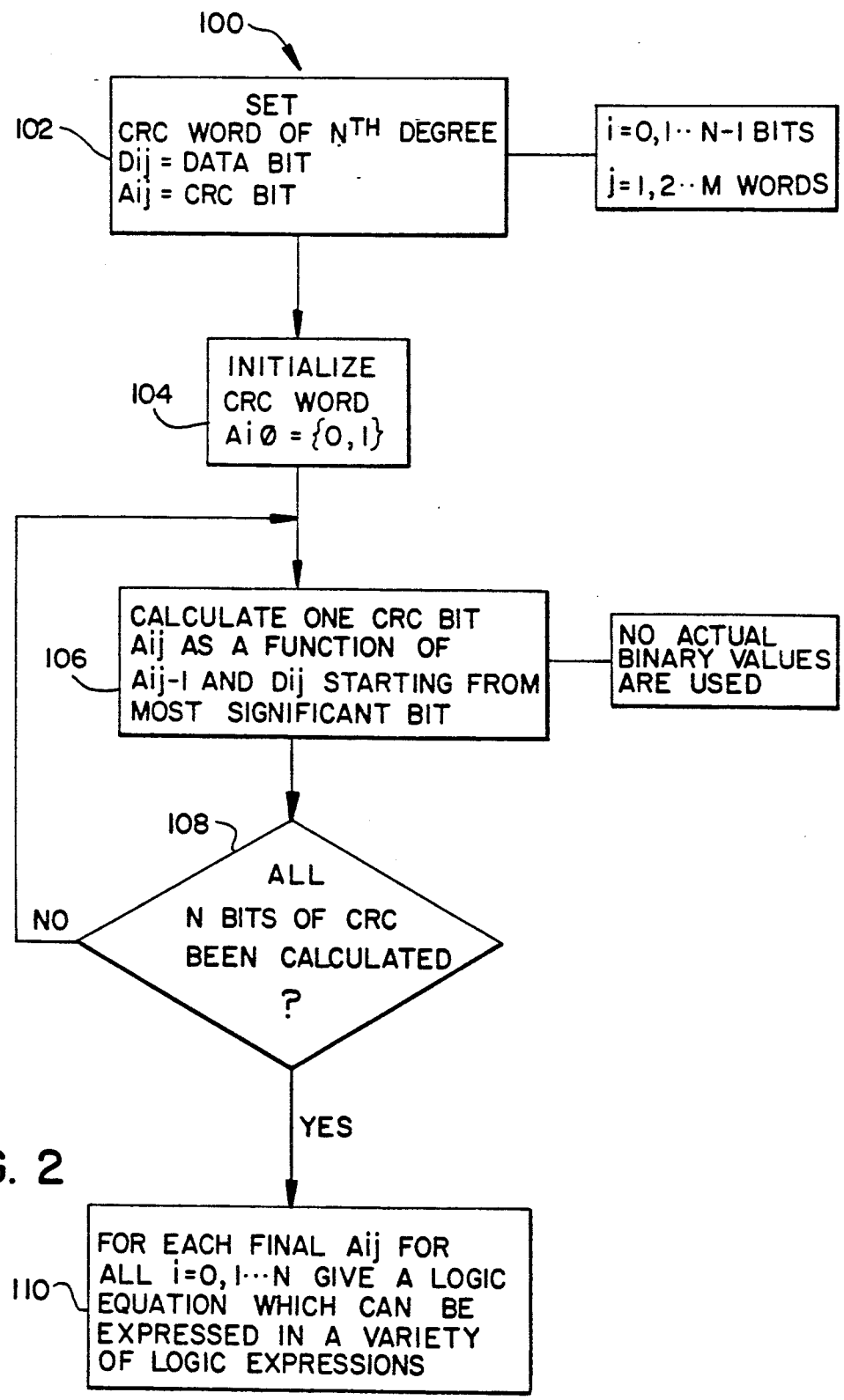
FIG. 2 is a flow chart representation depicting the basic operation of the computer program used to generate equations necessary to implement a selected CRC polynomial.

The outline of a program that is used to generate the carry look-ahead equations necessary to implement a given CRC polynomial is given in the flow chart of FIG. 2. The CRC polynomial may be the 16-bit CRC-CCITT (Consultative Committee for International Telephone and Telegraph) standard polynomial of the form given by $$F(x) = X^{16} + X^{12} + X^5 + 1.$$

It should be noted that the program can be easily modified to implement any of the other accepted standard CRC polynomials, as well as any other non-standard polynomials. The program outlined in the flow chart 100 given in FIG. 2 formulates the equations necessary to perform the calculation of the frame check sequence bits. Generally, these equations are carry look-ahead equations which mimic numeric division. As in any continuing division, the remainder must be added back in, and thus as shown in the flow chart, the equations are generated using data bits, Dij, and CRC bits, Aij.

Flow chart 100 is a simplified program outline which illustrates the various steps and decisions necessary to formulate carry look-ahead equations based on the given CRC polynomial. Process block 102 of flow chart 100 distinguishes the various parameters used in the remaining sections of the program. Process block 104 requires the initialization of CRC bit Aij. This initialization process is done in vector format since the variable Aij is two dimensional. Process block 106 requires the calculation of each of the CRC bits Aij as a function of the same bit, previous CRC word, $A_{i,j-1}$, and the data bit Dij. Decision block 108 merely checks to see if all the N bits of the CRC word have been calculated. Process block 110 requires that equations be generated for Aij in logic format. The logic format can be achieved using EXCLUSIVE OR, NOR, NAND, AND, OR, or any combination thereof.

The use of equations, generated by the program outlined in the flow chart of FIG. 2, that will calculate each bit of the cyclic redundancy code word in a carry look-ahead manner is essential to the operation of the present invention since this enables the simultaneous and parallel calculation of each CRC sequence bit simultaneously with the transmission of the data word bit from which the CRC bit is derived. The generated carry look-ahead equations are formed from data bits as well as CRC bits, and it is from this construction that all 16 bits of the cyclic redundancy code can be generated simultaneously in parallel format. Once the equations are generated they can be implemented in a variety of ways as will be hereinafter described in detail. Although the program does not detail the generation of the carry look-ahead equations, it provides the outline of the steps a programmer would take in developing the program. More importantly, the program itself is not the necessary part of the invention, but rather the use of a set of carry look-ahead equations themselves are needed to implement the invention. Once the set of equations or a set of equations functionally similar to the equations given in the table below are generated and implemented, the computer program itself is no longer needed.

Figure 3:
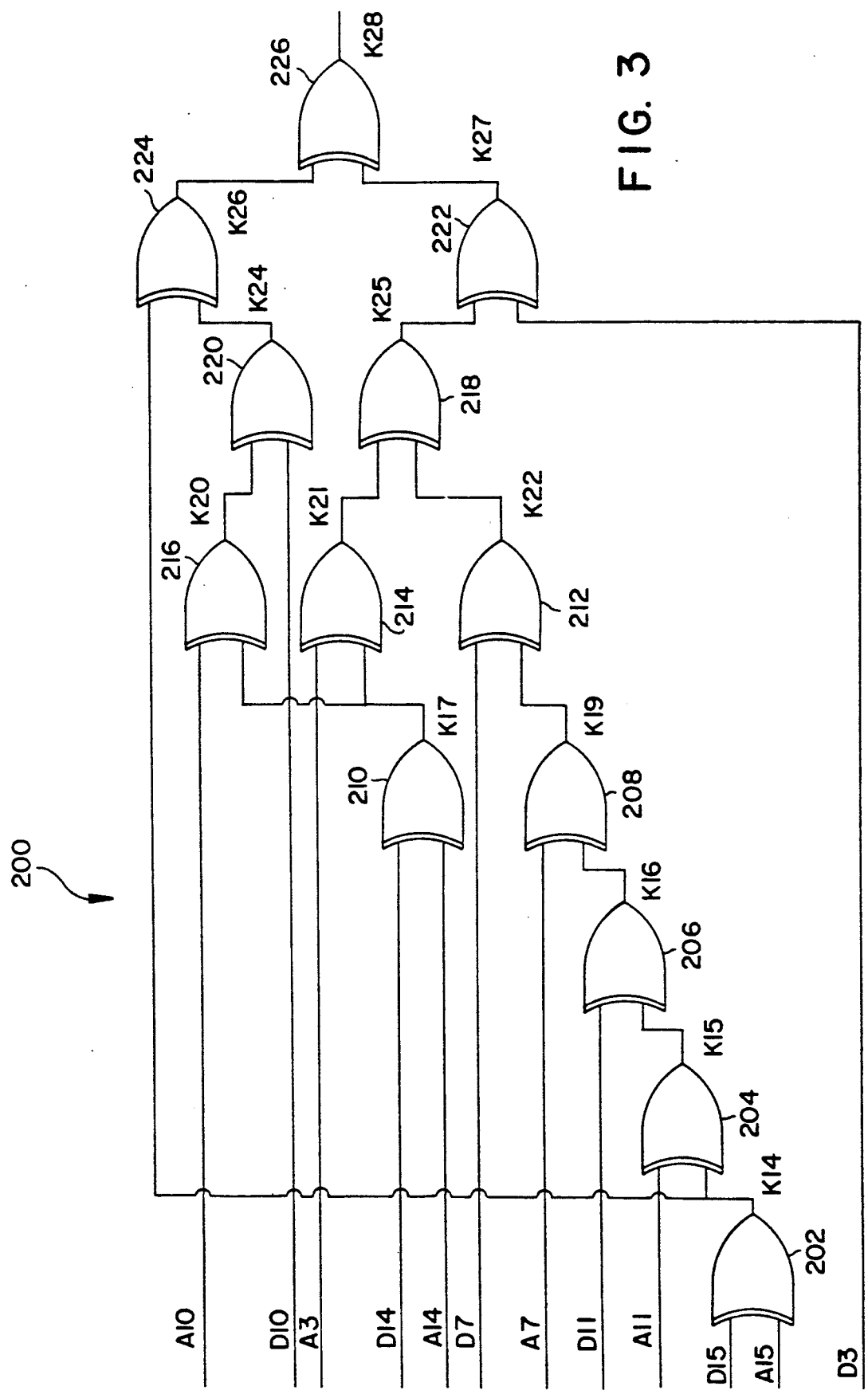
FIG. 3 is a schematic representation of the hardware implementation of CRC bit 15.

The Table below, contains a list of the computer generated equations, supplied by the program outlined in FIG. 2, for each of the 16 bits of the cyclic redundancy code word. FIG. 3 shows a discrete gate representation 200 of bit 15 of the cyclic redundancy code word. It is important to note that this is only a representation of one bit of the cyclic redundancy code word. In addition, the representation is shown using EXCLUSIVE OR gates, however, by using Boolean Algebra, the representation can be shown and accomplished using any type of gate operation such as AND, OR or NOR gates.

While the Table below sets forth the presently preferred and an enabling set of equations for use in generating the cyclic redundancy code word, it should be emphasized that the equations themselves are not the invention, but a representation of the present mode of the invention. If a different CRC polynomial is selected, then a different set of carry look-ahead equations would need to be created, via the program set forth in FIG. 2, to implement the simultaneous calculation of the new CRC polynomial in a carry look ahead manner. In addition, while it is noted that the preferred embodiment uses EXCLUSIVE OR gates, the chosen equations could also be implemented in various combinations of AND, OR, NAND, NOR and NOT gates. For example, any of the EXCLUSIVE OR gates with two logic level inputs, A and B, can be implemented using two NOT, two AND and one OR gate in the equivalent form of $A\bar{B} + \bar{A}B$.

Once the carry look-ahead equations are generated, they can be implemented in a variety of ways including software means and hardware means. If a software means is chosen, a computer program implements the generated equations and performs the necessary operations; however, a software implementation is inherently slower than a hardware implementation due to the speed limitations of the software chosen to implement the equations which would thereby lower the speed and effectiveness of the present invention. If a hardware implementation is chosen, there are a variety of technologies available. The equations can be implemented using discrete hardware components as shown in FIG. 3 or in programmable array logic devices. In addition, the equations can be implemented using custom gate arrays which are available from many manufacturers. The advantage of a custom gate array lies in the fact that each array is customized for the exact number of operations needed and no more.

In the preferred embodiment of this invention, the entire network is implemented using a custom gate array supplied from Fairchild which is a division of National Semiconductors, Incorporated. The gate array is a FGE 2500 Series gate array. The FGE is an advanced ECL gate array, ranging from 100 to 6300 equivalent gates, which offer system designers greater speed, gate density and functional flexibility. On one single gate array, all functions including all shift register operations and the generated equations can be implemented which will minimize propagation delays.

In order to establish a physical interpretation of the logic equations a discrete physical example is given. Given the logic equation for bit 15 of the CRC word shown in the Table, the discrete logic representation shown in FIG. 3 can be constructed. The general EXCLUSIVE OR operation is summerized below:

| A | + | B | C |
|---|---|---|---|
| 0 |   | 0 | 0 |
| 0 |   | 1 | 1 |
| 1 |   | 0 | 1 |
| 1 |   | 1 | 0 |

Referring to FIG. 3, EXCLUSIVE OR gate 202 performs the EXCLUSIVE OR operation on bits D15 and A15 and results in output K14. According to the EXCLUSIVE OR summary given above, if either A15 or D15 is a logic 1, but not the other, then the output of gate 202, K14, is a logic 1, otherwise it is a logic 0. EXCLUSIVE OR gate 204 has inputs K14 from gate 202 and A11. Once again, if either K14 or A11 is a logic 1, but not the other, then the output of gate 204, K15, is a logic 1, otherwise it is a logic 0. The inputs to gate 206 are K15 and D11 and the output is K16. The inputs to gate 208 are K16 and A7 and the output in K19. The inputs to gate 210 are A14 and D14 and the output is K17. The inputs to gate 212 are K19 and D7 and the output is K22. The input is K21. The inputs to gate 216 are K17 and A10 and the output is K20. The inputs to gate 218 are K21 and K22 and the output is K24. The inputs to gate 222 are K25 and D3 and the output is K27. The inputs to gate 224 are K24 and K14 and the output is K26. The inputs to gate 226 are K26 and K27 and the output of gate 226 is bit 15 of the frame check sequence, K28. Similar implementations are used for the other bits of the frame check sequence.

In the preferred embodiment of the invention the CRC polynomial, F(X) given by $$F(X) = X^{16} + X^{12} + X^5 + 1$$

is implemented wherein bit 0 is the least significant bit, and bit 15 is the most significant bit. A preferred set of equations that will enable the parallel calculation of the cyclic redundancy code word from the CRC polynomial are set forth in the following Table. The equations set forth in the Table for bit 15 may be compared with FIG. 3 and the above description of the gates, to illustrate the invention, when implemented to EXCLUSIVE OR logic. The number of EXCLUSIVE OR gates is determined by the number of EXCLUSIVE OR operations indicated by the equations given in the Table.

TABLE

BIT 0=((((A0)+(((A11)+((A15)+(D15)))+(D11)))+((((A4)+((A15)+(D15)))+(((A8)+((A12)+(D12)))+(D8)))+(D4)))+(D0))

| | | |
|---|---|---|
| K10=A12+D12 | K15=A4+K12 | K20=K18+D4 |
| K11=A15+D15 | K16=K13+D8 | K21=K19+K20 |
| K12=A15+D15 | K17=K14+D11 | K22=K21+D0 |
| K13=A8+K10 | K18=K15+K16 | |
| K14=A11+K11 | K19=A0+K17 | |

BIT 1=((((A1)+((A12)+(D12)))+(((A5)+(((A9)+((A13)+(D13)))+(D9)))+(D5)))+(D1))

| | | |
|---|---|---|
| K24=A13+D13 | K27=A12+D12 | K30=K28+D5 |

TABLE-continued

| | | |
|---|---|---|
| K25=A9+K24 | K28=A5+K26 | K31=K29+K30 |
| K26=K25+D9 | K29=A1+K27 | K32=K31+D1 |

BIT 2=((((A2)+((A13)+(D13)))+(((A6)+(((A10)+((A14)+(D14)))+(D10)))+(D6)))+(D2))

| | | |
|---|---|---|
| K34=A14+D14 | K37=A13+D13 | K40=K38+D6 |
| K35=A10+K34 | K38=A6+K36 | K41=K39+K40 |
| K36=K35+D10 | K39=A2+K37 | K42=K41+D2 |

BIT 3=((((A3)+((A14)+(D14)))+(((A7)+(((A11)+((A15)+(D15)))+(D11)))+(D7)))+(D3))

| | | |
|---|---|---|
| K44=A15+D15 | K47=A14+D14 | K50=K48+D7 |
| K45=A11+K44 | K48=A7+K46 | K51=K49+K50 |
| K46=K45=D11 | K49=A3+K47 | K52=K51+D3 |

BIT 4=((((A4)+((A15)+(D15)))+(((A8)+((A12)+(D12)))+(D8)))+(D4))

| | | |
|---|---|---|
| | K54=A12+D12 | K57=A4+K55 |
| | K55=A15+D15 | K58=K56+D8 |
| | K56=A8+K54 | K59=K57+K58 |
| | | K60=K59+D4 |

BIT 5=((((A5)+(((A9)+((A13)+(D13)))+(D9)))+(D5))+((((A0)+(((A11)+((A15)+(D15)))+(D11)))+((((A4)+((A15)+(D15)))+(((A8)+((A12)+(D12)))+(D8)))+(D4)))+(D0)))

| | | |
|---|---|---|
| K62=A12+D12 | K68=A4+K64 | K74=A0+K71 |
| K63=A15+D15 | K69=K65+D8 | K75=K72+D4 |
| K64=A15+D15 | K70=A9+K66 | K76=A5+K73 |
| K65=A8+K62 | K71=K67+D11 | K77=K74+K75 |
| K66=A13+D13 | K72=K68+K69 | K78=K76+D5 |
| K67=A11+K63 | K73=K70+D9 | K79=K77+D0 |
| | | K80=K78+K79 |

BIT 6=((((A6)+(((A10)+((A14)+(D14)))+(D10)))+(D6))+((((A1)+((A12)+(D12)))+(((A5)+(((A9)+((A13)+(D13)))+(D9)))+(D5)))+(D1)))

| | | |
|---|---|---|
| K82=A13+D13 | K87=A12+D12 | K92=A6+K89 |
| K83=A9+K82 | K88=A5+K85 | K93=K90+K91 |
| K84=A14+D14 | K89=K86+D10 | K94=K92+D6 |
| K85=K83+D9 | K90=A1+K87 | K95=K93+D1 |
| K86=A10+K84 | K91=K88+D5 | K96=K94+K95 |

BIT 7=((((A7)+(((A11)+((A15)+(D15)))+(D11)))+(D7))+((((A2)+((A13)+(D13)))+(((A6)+(((A10)+((A14)+(D14)))+(D10)))+(D6)))+(D2)))

| | | |
|---|---|---|
| K98=A14+D14 | K03=A13+D13 | K08=A7+K05 |
| K99=A10+K98 | K04=A6+K01 | K09=K06+K07 |
| K00=A15+D15 | K05=K02+D11 | K10=K08+D7 |
| K01=K99+D10 | K06=A2+K03 | K11=K09+D2 |
| K02=A11+K00 | K07=K04+D6 | K12=K10+K11 |

BIT 8=((((A8)+((A12)+(D12)))+(D8))+((((A3)+((A14)+(D14)))+(((A7)+(((A11)+((A15)+(D15)))+(D11)))+(D7)))+(D3)))

| | | |
|---|---|---|
| K14=A15+D15 | K19=A12+D12 | K23=K20+K21 |
| K15=A11+K14 | K20=A3+K17 | K24=K22+D8 |
| K16=K15+D11 | K21=K18+D7 | K25=K23+D3 |
| K17=A14+D14 | K22=A8+K19 | K26=K24+K25 |
| K18=A7+K16 | | |

BIT 9=((((A9)+((A13)+(D13)))+(D9))+((((A4)+((A15)+(D15)))+(((A8)+((A12)+(D12)))+(D8)))+(D4)))

| | | | |
|---|---|---|---|
| K28=A12+D12 | K31=A13+D13 | K34=A9+K31 | K37=K35+D4 |
| K29=A15+D15 | K32=A4+K29 | K35=K32+K33 | K38=K36+K37 |
| K30=A8+K28 | K33=K30+D8 | K36=K34+D9 | |

BIT 10=((((A10)+((A14)+(D14)))+(D10))+(((A5)+(((A9)+((A13)+(D13)))+(D9)))+(D5)))

| | | |
|---|---|---|
| K40=A13+D13 | K43=K41+D9 | K46=K44+D10 |
| K41=A9+K40 | K44=A10+K42 | K47=K45+D5 |
| K42=A14+D14 | K45=A5+K43 | K48=K46+K47 |

BIT 11=((((A11)+((A15)+(D15)))+(D11))+(((A6)+(((A10)+((A14)+(D14)))+(D10))+(D6))))

| | | |
|---|---|---|
| K50=A14+D14 | K53=K51+D10 | K56=K54+D11 |
| K51=A10+D50 | K54=A11+K52 | K57=K55+D6 |
| K52=A15+D15 | K55=A6+K53 | K58=K56+K57 |

BIT 12=((((A12)+(D12))+(((A7)+(((A11)+((A15)+(D15)))+(D11))+(D7)))+((((A0)+(((A11)+((A15)+(D15)))+(D11)))+((((A4)+((A15)+(D15)))+(((A8)+((A12)+(D12)))+(D8)))+(D4)))+(D0)))

| | | |
|---|---|---|
| K60=A12+D12 | K67=A4+K63 | K74=K71+D4 |
| K61=A15+D15 | K68=K64+D8 | K75=A12+D12 |

TABLE-continued

| | | |
|---|---|---|
| K62=A15+D15 | K69=K65+D11 | K76=K72+D7 |
| K63=A15+D15 | K70=K66+D11 | K77=K73+K74 |
| K64=A8+K60 | K71=K67+K68 | K78=K75+K76 |
| K65=A11+K61 | K72=A7+K69 | K79=K77+D0 |
| K66=A11+K62 | K73=A0+K70 | K80=K78+K79 |

BIT 13=((((A13)+(D13))+(((A8)+((A12)+(D12)))+(D8)))+((((A1)+((A12)+(D12)))+(((A5)+(((A9)+((A13)+(D13)))+(D9)))+(D5)))+(D1)))

| | | |
|---|---|---|
| K82=A13+D13 | K87=A5+K84 | K92=K88+D8 |
| K83=A9+K82 | K88=A8+K85 | K93=K89+K90 |
| K84=K83+D9 | K89=A1+K86 | K94=K91+K92 |
| K85=A12+D12 | K90=K87+D5 | K95=K93+D1 |
| K86=A12+D12 | K91=A13+D13 | K96=K94+K95 |

BIT 14=((((A14)+(D14))+(((A9)+((A13)+(D13)))+(D9)))+((((A2)+((A13)+(D13)))+(((A6)+(((A10)+((A14)+(D14)))+(D10)))+(D6)))+(D2)))

| | | |
|---|---|---|
| K98=A14+D14 | K03=A6+K00 | K08=K04+D9 |
| K99=A10+K98 | K04=A9+K01 | K09=K05+K06 |
| K00=K99+D10 | K05=A2+K02 | K10=K07+K08 |
| K01=A13+D13 | K06=K03+D6 | K11=K09+D2 |
| K02=A13+D13 | K07=A14+D14 | K12=K10+K11 |

BIT 15=((((A15)+(D15))+(((A10)+((A14)+(D4)))+(D10)))+((((A3)+((A14)+(D14)))+(((A7)+(((A11)+((A15)+(D15)))+(D11)))+(D7)))+(D3)))

| | | |
|---|---|---|
| K14=A15+D15 | K19=A7+K16 | K24=K20+D10 |
| K15=A11+K14 | K20=A10+K17 | K25=K21+K22 |
| K16=K15+D11 | K21=A3+K18 | K26=K23+K24 |
| K17=A14+D14 | K22=K19+D7 | K27=K25+D3 |
| K18=A14+D14 | K23=A15+D15 | K28=K26+K27 |

* K = Exclusive or Operation
* BIT 0 = Least Significant Bit

The CRC network of the present invention places the data in parallel format and utilizes computer generated equations that provide for parallel format and simultaneous calculations of cyclic redundancy code bits so that the remainder of the polynomial divisions or cyclic redundancy code words can be generated through combinational logic for each CRC bit simultaneously rather than sequentially as is currently done. In this case, the total computational delay is equal to the worst path delay of one of the bits of the frame check sequence word plus the time to store it in a flip-flop. This is extremely important when transmission of data is at a high rate. The difficulty at high data rates with the previous art is that they require an amount of processing time, at a minimum, equal to a bit duration, for each transmitted bit, because the latter is shifted serially into the CRC generator/tester at the same time it is transmitted on the interconnecting medium. The data rate is therefore limited by the processing time of the frame check sequence word regardless of the type, parallel or serial format, of system as shown in prior art. The present invention, utilizing ECL gate technology, represents an improvement in speed by a factor of approximately 32. By using this invention as described herein, transmission rates of up to 3.2 Gigabits/second are possible. With the gallium arsenide technology emerging today, data rates of over 10 Gigabits/second should be possible.

Although shown and described in what are believed to be the most practical and preferred embodiments, it is apparent that departures from specific methods and designs described and shown will suggest themselves to those skilled in the art and may be used without departing from the spirit and scope of the invention. The present invention is not restricted to the particular constructions described and illustrated, but should be construed to cohere of all modifications that may fall within the scope of the appended claims.

What is claimed is:

1. A high speed parallel format error detection network for detecting errors in transmitted data comprising:
   (a) transmitter means, said transmitter means receiving a plurality of parallel n bit data words for transmission, each data word having n bits denoted as $D_o$ through $D_{n-1}$, said plurality of data forming a message;
   (b) a combinational logic circuit for calculating an n bit check frame sequence, said combinational logic circuit having a means for calculating a plurality of sequential intermediate n bit CRC words in parallel format during data transmission wherein each bit of each intermediate CRC word is calculated simultaneously from a sum of the data word and the prior intermediate CRC word having n bits denoted as $A_o$ through $A_{n-1}$, said circuit shifting a first final CRC word out as the frame check sequence, said combinational logic circuit implementing a plurality of carry look-ahead equations in which:

BIT 0=((((A0)+(((A11)+((A15)+(D15)))+(D11)))+((((A4)+((A15)+(D15)))+(((A8)+((A12)+(D12)))+(D8)))+(D4)))+(D0)),

BIT 1=((((A1)+((A12)+(D12)))+(((A5)+((A9)+((A13)+(D13)))+(D9)))+(D5)))+(D1)),

BIT 2=((((A2)+((A13)+(D13)))+(((A6)+((A10)+(A14)+(D14)))+(D10)))+(D6)))+(D2)),

BIT 3=((((A3)+((A14)+(D14)))+(((A7)+((A11)+((A15)+(D15)))+(D11)))+(D7)))+(D3)),

BIT 4=((((A4)+((A15)+(D15)))+(((A8)+((A12)+(D12)))+(D8)))+(D4)),

BIT 5=((((A5)+(((A9)+(A13)+(D13)))+(D9)))+(D5))+((((A0)+(((A11)+((A15)+(D15)))+(D11)))+((((A4)+((A15)+(D15)))+(((A8)+

-continued
((A12)+(D12)))+(D8)))+(D4)))+(D0))),

BIT 6=((((A6)+(((A10)+((A14)+(D14)))+(D10)))+
(D6))+((((A1)+((A12)+(D12)))+(((A5)+
(((A9)+((A13)+(D13)))+(D9)))+(D5)))+(D1))),

BIT 7=((((A7)+(((A11)+((A15)+(D15)))+(D11)))+
(D7))+(((A2)+((A13)+(D13)))+(((A6)+(((A10)+
((A14)+(D14)))+(D10)))+(D6)))+(D2))),

BIT 8=((((A8)+((A12)+(D12)))+(D8))+((((A3)+
((A14)+(D14)))+(((A7)+(((A11)+((A15)+
(D15)))+(D11)))+(D7)))+(D3))),

BIT 9=((((A9)+((A13)+(D13)))+(D9))+((((A4)+
((A15)+(D15)))+(((A8)+((A12)+(D12)))+
(D8)))+(D4))),

BIT 10=((((A10)+((A14)+(D14)))+(D10))+(((A5)+
(((A9)+((A13)+D13)))+(D9)))+(D5))),

BIT 11=((((A11)+((A15)+(D15)))+(D11))+(((A6)+
(((A10)+((A14)+(D14)))+(D10)))+(D6))),

BIT 12=((((A12)+D12))+(((A7)+(((A11)+((A15)+
(D15)))+D11))+(D7)))+((((A0)+(((A11)+((A15)+
(D15)))+(D11)))+((((A4)+((A15)+(D15)))+(((A8)+
((A12)+(D12)))+(D8)))+(D4)))+(D0))),

BIT 13=((((A13)+(D13))+(((A8)+((A12)+(D12)))+
(D8)))+((((A1)+((A12)+(D12)))+((A5)+(((A9)+
((A13)+(D13)))+(D9)))+(D5)))+(D1))),

BIT 14=((((A14)+(D14))+(((A9)+((A13)+(D13)))+
(D9)))+((((A2)+((A13)+(D13)))+(((A6)+(((A10)+
((A14)+(D14)))+(D10)))+(D6)))+(D2))),

BIT 15=((((A15)+(D15))+(((A10)+((A.14)+(D14)))+
(D10)))+((((A3)+((A14)+(D14)))+(((A7)+(((A11)+
((A15)+(D15)))+(D11)))+(D7)))+(D3)));

(c) means for appending said first CRC word to said message to form a frame check sequence;
(d) data bus means for carrying said frame check sequence;
(e) receiving means for receiving said frame check sequence;
(f) a combination logic circuit for calculating a second final CRC word for the received n bit frame check sequence, said combination logic circuit having a means for calculating a plurality of sequential intermediate n bit CRC words in parallel format during data reception wherein each bit of said second each intermediate CRC word is calculated simultaneously from a sum of the data word and the prior intermediate CRC word said circuit shifting a first final CRC word out as the frame check sequence, said combination logic circuit implementing a plurality of carry look-ahead equations in which:

BIT 0=((((A0)+(((A11)+((A15)+(D15)))+(D11)))+
((((A4)+((A15)+(D15)))+(((A8)+((A12)+
(D12)))+(D8)))+(D4)))+(D0)),

BIT 1=((((A1)+((A12)+(D12)))+(((A5)+((A9)+
((A13)+(D13)))+(D9)))+(D5)))+(D1)),

BIT 2=((((A2)+((A13)+(D13)))+(((A6)+((A10)+
(A14)+(D14)))+(D10)))+(D6)))+(D2)),

BIT 3=((((A3)+((A14)+(D14)))+(((A7)+((A11)+
((A15)+(D15)))+(D11)))+(D7)))+(D3)),

BIT 4=((((A4)+((A15)+(D15)))+(((A8)+((A12)+
(D12)))+(D8)))+(D4)),

-continued
BIT 5=((((A5)+(((A9)+(A13)+(D13)))+(D9)))+
(D5))+((((A0)+(((A11)+((A15)+(D15)))+
(D11)))+((((A4)+((A15)+(D15)))+(((A8)+
((A12)+(D12)))+(D8)))+(D4)))+(D0))), BIT 6=((((A6)+(((A10)+((A14)+(D14)))+(D10)))+
(D6))+((((A1)+((A12)+(D12)))+(((A5)+
(((A9)+((A13)+(D13)))+(D9)))+(D5)))+(D1))), BIT 7=((((A7)+(((A11)+((A15)+(D15)))+(D11)))+
(D7))+(((A2)+((A13)+(D13)))+(((A6)+(((A10)+
((A14)+(D14)))+(D10)))+(D6)))+(D2))), BIT 8=((((A8)+((A12)+(D12)))+(D8))+((((A3)+
((A14)+(D14)))+(((A7)+(((A11)+((A15)+
(D15)))+(D11)))+(D7)))+(D3))), BIT 9=((((A9)+((A13)+(D13)))+(D9))+((((A4)+
((A15)+(D15)))+(((A8)+((A12)+(D12)))+
(D8)))+(D4))), BIT 10=((((A10)+((A14)+(D14)))+(D10))+(((A5)+
(((A9)+((A13)+D13)))+(D9)))+(D5))), BIT 11=((((A11)+((A15)+(D15)))+(D11))+(((A6)+
(((A10)+((A14)+(D14)))+(D10)))+(D6))), BIT 12=((((A12)+D12))+(((A7)+(((A11)+((A15)+
(D15)))+D11))+(D7)))+((((A0)+(((A11)+((A15)+
(D15)))+(D11)))+((((A4)+((A15)+(D15)))+(((A8)+
((A12)+(D12)))+(D8)))+(D4)))+(D0))), BIT 13=((((A13)+(D13))+(((A8)+((A12)+(D12)))+
(D8)))+((((A1)+((A12)+(D12)))+((A5)+(((A9)+
((A13)+(D13)))+(D9)))+(D5)))+(D1))), BIT 14=((((A14)+(D14))+(((A9)+((A13)+(D13)))+
(D9)))+((((A2)+((A13)+(D13)))+(((A6)+(((A10)+
((A14)+(D14)))+(D10)))+(D6)))+(D2))), BIT 15=((((A15)+(D15))+(((A10)+((A.14)+(D14)))+
(D10)))+((((A3)+((A14)+(D14)))+(((A7)+(((A11)+
((A15)+(D15)))+(D11)))+(D7)))+(D3)));

(g) means for logically comparing said first CRC word with said second CRC word to determine if an error has occurred in the transmission of said data words.

2. An error detection network according to claim 1, wherein said transmitter means further includes a plurality of shift registers for shifting parallel data to said combinational logic circuit to calculate said CRC word.

3. An error detection network according to claim 1, wherein said transmitter means further includes a shift register for converting said plurality of parallel n bit data words into serial bit data words for transmission over said data bus means.

4. An error detection network according to claim 2 or 3, said transmitter means comprising:
   a first shift register for storing and shifting input data from parallel format to serial format,
   a second shift register for storing and shifting input data in parallel format,
   a third shift register for storing and shifting input data in parallel format and in serial format, and
   means interconnecting said first, and second shift registers and joining said second and third shift registers to said combinational logic circuit for calculating said first CRC word.

5. An error detection network according to claim 4, wherein said shift registers are responsive to a clock pulse for shifting said data.

6. An error detection network according to claim 1, wherein said frame check sequence is comprised of a first n bit CRC word calculated by said combinational logic circuit and said message.

7. An error detection network according to claim 6, wherein each bit of said first n bit CRC word is calculated simultaneously in parallel format.

8. An error detection network according to claim 1, wherein said combinational logic circuit calculates said first n bit CRC word by using a set of carry look-ahead equations to perform a division operation, said carry look-ahead equations utilizing a preselected CRC polynomial.

9. An error detection network according to claim 8, wherein said preselected CRC polynomial is:

$$F(X) = X^{16} + X^{12} + X^5 + 1.$$

10. An error detection network according to claim 1, said receiver means comprising:
  a first shift register for receiving said frame check sequence, said register comprising a serial to parallel
  a second shift register for storing and shifting said frame check sequence from said first shift register,
  a third shift register for storing and shifting input data in parallel format and in serial format, and
  means interconnecting said first, and second shift registers and joining said second and third shift registers to said combinational logic circuit for calculating said second CRC word.

11. An error detection network according to claim 10, wherein said second CRC word is a second n bit CRC word calculated by said combinational logic circuit.

12. An error detection network according to claim 11, wherein said combinational logic circuit calculates said second n bit CRC word by using a set of carry look-ahead equations to perform a division operation, said carry look-ahead equations utilizing a pre-selected CRC polynomial.

13. An error detection network according to claim wherein said data bus carries said frame check sequence in serial format.

14. A high speed parallel bit format cyclic redundancy code generator comprising:
  (a) a first means for shifting n bit parallel format input data into a combination logic circuit;
  (b) a second means for shifting parallel format output from said combinational logic circuit back into said combination logic circuit for a predetermined number of shifts, said output from said combinational logic circuit comprising n bits and then converting a remaining parallel format output from said combinational logic circuit to serial format as a first CRC word;
  (c) said combinational logic circuit calculating said first CRC words from said n bit parallel format input data based on a combination of data bits denoted as $D_0$ to $D_{n-1}$ and CRC bits denoted as $A_0$ to $A_{n-1}$, said combinational logic circuit including a custom configured gate array means which receives each bit of each intermediate CRC word simultaneously to perform a series of calculation in which:

BIT 0=((((A0)+(((A11)+((A15)+(D15)))+(D11)))+ ((((A4)+((A15)+(D15)))+(((A8)+((A12)+ (D12)))+(D8)))+(D4)))+(D0)),

-continued

BIT 1=((((A1)+((A12)+(D12)))+(((A5)+((A9)+ ((A13)+(D13)))+(D9)))+(D5)))+(D1)),

BIT 2=((((A2)+((A13)+(D13)))+(((A6)+((A10)+ (A14)+(D14)))+(D10)))+(D6)))+(D2)),

BIT 3=((((A3)+((A14)+(D14)))+(((A7)+((A11)+ ((A15)+(D15)))+(D11)))+(D7)))+(D3)),

BIT 4=((((A4)+((A15)+(D15)))+(((A8)+((A12)+ (D12)))+(D8)))+(D4)),

BIT 5=((((A5)+(((A9)+(A13)+(D13)))+(D9)))+ (D5))+((((A0)+(((A11)+((A15)+(D15)))+ (D11)))+((((A4)+((A15)+(D15)))+(((A8)+ ((A12)+(D12)))+(D8)))+(D4)))+(D0))),

BIT 6=((((A6)+(((A10)+((A14)+(D14)))+(D10)))+ (D6))+((((A1)+((A12)+(D12)))+(((A5)+ (((A9)+((A13)+(D13)))+(D9)))+(D5)))+(D1))),

BIT 7=((((A7)+(((A11)+((A15)+(D15)))+(D11)))+ (D7))+(((A2)+((A13)+(D13)))+(((A6)+(((A10)+ ((A14)+(D14)))+(D10)))+(D6)))+(D2))),

BIT 8=((((A8)+((A12)+(D12)))+(D8))+((((A3)+ ((A14)+(D14)))+(((A7)+((A11)+((A15)+ (D15)))+(D11)))+(D7)))+(D3))),

BIT 9=((((A9)+((A13)+(D13)))+(D9))+((((A4)+ ((A15)+(D15)))+(((A8)+((A12)+(D12)))+ (D8)))+(D4))),

BIT 10=((((A10)+((A14)+(D14)))+(D10))+(((A5)+ (((A9)+((A13)+D13)))+(D9)))+(D5))),

BIT 11=((((A11)+((A15)+(D15)))+(D11))+(((A6)+ (((A10)+((A14)+(D14)))+(D10)))+(D6))),

BIT 12=((((A12)+D12))+(((A7)+(((A11)+((A15)+ (D15)))+D11)))+(D7)))+((((A0)+(((A11)+((A15)+ (D15)))+(D11)))+((((A4)+((A15)+(D15)))+(((A8)+ ((A12)+(D12)))+(D8)))+(D4)))+(D0))),

BIT 13=((((A13)+(D13))+(((A8)+((A12)+(D12)))+ (D8)))+((((A1)+((A12)+(D12)))+(((A5)+(((A9)+ ((A13)+(D13)))+(D9)))+(D5)))+(D1))),

BIT 14=((((A14)+(D14))+(((A9)+((A13)+(D13)))+ (D9)))+((((A2)+((A13)+(D13)))+(((A6)+(((A10)+ ((A14)+(D14)))+(D10)))+(D6)))+(D2))),

BIT 15=((((A15)+(D15))+(((A10)+((A.14)+(D14)))+ (D10)))+((((A3)+((A14)+(D14)))+(((A7)+(((A11)+ ((A15)+(D15)))+(D11)))+(D7)))+(D3)));

(d) a clock means for supplying a clock pulse to said first and second means to provide synchronous timing; and
(e) means interconnecting said first and second means and joining said first and second means to said combinational logic circuit.

15. A cyclic redundancy code generator according to claim 14, wherein said cyclic redundancy code generator further includes a parallel-to-serial shift register responsive to said clock means for converting and shifting data.

16. A cyclic redundancy code generator according to claim 15, wherein said first means is a parallel-to-parallel shift register responsive to said clock means for shifting data.

17. A cyclic redundancy code generator according to claim 16, wherein said parallel-to-serial shift register converts and shifts n bit parallel format input data supplied from a message generation means into serial format data for transmission over a serial data line.

18. A cyclic redundancy code generator according to claim 17, wherein said parallel-to-parallel shift register shifts n bit parallel format data supplied from said message generation means into said combinational logic circuit.

19. A cyclic redundancy code generator according to claim 14, wherein said second means is a parallel-to-parallel and parallel-to-serial shift register responsive to said clock means for converting and shifting data.

20. A cyclic redundancy code generator according to claim 19, wherein said parallel-to-parallel and parallel-to-serial shift register receives parallel format output from said combinational logic circuit and shifts said parallel format output back into said combinational logic circuit for a predetermined number of shifts before converting said parallel format data into serial data for transmission over a serial data line as a CRC word.

21. A cyclic redundancy code generator according to claim 14, wherein said combinational logic circuit calculates said first CRC word from said n bit parallel format input supplied by said first and second means by using a set of carry look-ahead equations to perform a numeric division operation using said parallel format input data, said carry look-ahead equations utilizing a preselected CRC polynomial.

22. A cyclic redundancy code generator according to claim 21, wherein each bit of said CRC word is calculated simultaneously in parallel format.

23. A cyclic redundancy code generator according to claim 21, wherein said preselected CRC polynomial is:

$$F(X) = X^{16} + X^{12} + X^5 + 1.$$

24. A cyclic redundancy code generator according to claim 14, wherein said interconnecting means comprises a plurality of parallel format data buses.

25. A high speed receiver and parallel bit format cyclic redundancy code detector comprising:
   (a) a first conversion means for converting a serial format received frame check sequence into n bit parallel format words and a first CRC word;
   (b) a second conversion means for shifting n bit parallel format words from said first conversion means into a combination logic circuit;
   (c) a third conversion means for shifting parallel format output from said combination logic circuit back to said combinational logic circuit, said parallel format output comprising n bits;
   (d) a combinational logic circuit for calculating a second CRC word from the n bit parallel format words based on a combination of data bits denoted as $D_o$ through $D_{n-1}$ and CRC bits denoted as $A_o$ through $A_{n-1}$, said combinational logic circuit including a custom configured gate array means which receives each bit of each intermediate CRC word simultaneously to perform a series of calculations in which:

BIT 0 = ((((A0)+(((A11)+((A15)+(D15)))+(D11)))+
((((A4)+((A15)+(D15)))+(((A8)+((A12)+(D12)))+(D8)))+
(D4)))+(D0)),
BIT 1 = ((((A1)+((A12)+(D12)))+(((A5)+(((A9)+((A13)+
(D13)))+(D9)))+(D5)))+(D1)),
BIT 2 = ((((A2)+((A13)+(D13)))+(((A6)+(((A10)+((A14)+
(D14)))+(D10)))+(D6)))+(D2)),
BIT 3 = (((A3)+((A14)+(D14)))+(((A7)+(((A11)+((A15)+
(D15)))+(D11)))+(D7)))+(D3)),
BIT 4 = ((((A4)+((A15)+(D15)))+(((A8)+((A12)+(D12)))+
(D8)))+(D4)),
BIT 5 = ((((A5)+(((A9)+((A13)+(D13)))+(D9)))+(D5))+

-continued ((((A0)+(((A11)+((A15)+(D15)))+(D11)))+((((A4)+((A15)+
(D15)))+(((A8)+((A12)+(D12)))+(D8)))+(D4)))+(D0))),
BIT 6 = ((((A6)+(((A10)+((A14)+(D14)))+(D10))+(D6))+
((((A1)+((A12)+(D12)))+(((A5)+(((A9)+((A13)+(D13))+
(D9)))+(D5)))+(D1)),
BIT 7 = ((((A7)+(((A11)+((A15)+(D15)))+(D11)))+(D7))+
((((A2)+((A13)+(D13)))+(((A6)+(((A10)+((A14)+(D14)))+
(D10)))+(D6)))+(D2))),
BIT 8 = ((((A8)+((A12)+(D12)))+(D8))+((((A3)+((A14)+
(D14)))+(((A7)+(((A11)+((A15)+(D15)))+(D11)))+
(D7)))+(D3))),
BIT 9 = ((((A9)+((A13)+(D13)))+(D9))+((((A4)+((A15)+
(D15)))+(((A8)+((A12)+(D12)))+(D8)))+(D4))),
BIT 10 = ((((A10)+((A14)+(D14)))+(D10))+(((A5)+(((A9)+
((A13)+(D13)))+(D9)))+(D5))),
BIT 11 = ((((A11)+((A15)+(D15)))+(D11))+(((A6)+(((A10)+
((A14)+(D14)))+(D10)))+(D6))),
BIT 12 = ((((A12)+(D12))+(((A7)+(((A11)+((A15)+(D15)))+
(D11)))+(D7)))+((((A0)+(((A11)+((A15)+(D15)))+
(D11)))+((((A4)+((A15)+(D15)))+(((A8)+((A12)+(D12)))+
(D8)))+(D4)))+(D0))),
BIT 13 = ((((A13)+(D13))+(((A8)+((A12)+(D12)))+(D8)))+
((((A1)+((A12)+(D12)))+(((A5)+(((A9)+((A13)+(D13)))+
(D9)))+(D5)))+(D1))),
BIT 14 = ((((A14)+(D14))+(((A9)+((A13)+(D13)))+(D9)))+
((((A2)+((A13)+(D13)))+(((A6)+(((A10)+((A14)+(D14)))+
(D10)))+(D6)))+(D2))),
BIT 15 = ((((A15)+(D15))+(((A10)+((A14)+(D14)))+(D10)))+
((((A3)+((A14)+(D14)))+(((A7)+(((A11)+((A15)+(D15)))+
(D11)))+(D7)))+(D3)));

and (e) a clock means for supplying a clock pulse to said first, second and third conversion means, to provide synchronous timing;
   (f) a comparison means for comparing said first CRC word with said second CRC word to determine of an error in transmission has occurred; and
   (g) means interconnecting said first and second conversion means and joining said second and third conversion means to said combination logic circuit.

26. A cyclic redundancy code detector according to claim 25, wherein said first conversion means is a serial-to-parallel shift register responsive to said clock means for converting said received frame check sequence into n bit parallel format words and said first CRC word.

27. A cyclic redundancy code detector according to claim 26, wherein said serial-to-parallel shift register converts and shifts a serial format received frame check sequence supplied from a serial data line into n bit parallel words and a first CRC word.

28. A cyclic redundancy code detector according to claim 25, wherein said second conversion means is a parallel-to-parallel shift register responsive to said clock means for shifting data words.

29. A cyclic redundancy code detector according to claim 28, wherein said parallel-to-parallel shift register shifts n bit parallel format words supplied from said serial-to-parallel shift register into said combinational logic circuit.

30. A cyclic redundancy code detector according to claim 25, wherein said third conversion means includes a parallel-to-parallel shift register responsive to said clock means.

31. A cyclic redundancy code detector according to claim 30, wherein said parallel-to-parallel shift register receives parallel format output from said combinational logic circuit and shifts said parallel format output back into said combinational logic circuit.

32. A cyclic redundancy code detector according to claim 25, wherein said combinational logic circuit calculates said second CRC word from said n bit parallel format words supplied by the first conversion means and the parallel format output supplied by said second conversion means by using a set of carry look-ahead equations to perform a numeric division operation, said carry look-ahead equations utilizing a preselected CRC polynomial.

33. A cyclic redundancy code detector according to claim 32, wherein each bit of said second n bit CRC word is calculated simultaneously in parallel format.

34. A cyclic redundancy code detector according to claim 32, wherein said preselected CRC polynomial is:

$$F(X) = X^{16} + X^{12} + X^5 + 1$$

35. A cyclic redundancy code detector according to claim 25, wherein said comparison means includes a flip-flop circuit.

36. A cyclic redundancy code detector according to claim 25, wherein said interconnecting means comprises a plurality of parallel format data buses.

37. A method of generating a cyclic redundancy code word for detecting errors that may have occured in the transmission of the telecommunications data, said method comprising the steps of:
(a) transmitting a plurality of n bit data words over a data line, each data word having n bits denoted as $D_o$ through $D_{n-1}$, said data words comprising a message;
(b) shifting said plurality of n bit data words into a combinational logic circuit in parallel format;
(c) shifting parallel format output from said combinational logic circuit back into said combinational logic circuit for a predetermined number of shifts and then converting a remaining parallel format output from said combinational logic circuit to serial format to form a first n bit CRC word, said output from said combinational logic circuit comprising n bits;
(d) calculating said first n bit CRC word from said n bit data words and said parallel format outputs, said combinational logic circuit for calculating a plurality of sequential intermediate n bit CRC words in parallel format during data transmission wherein each bit of each intermediate CRC word is calculated simultaneously as a sum of the data word and the prior intermediate CRC word having n bits denoted as $A_o$ through $A_{n-1}$, said combinational logic circuit implementing a plurality of carry look-ahead equations in which:

BIT 0=((((A0)+(((A11)+((A15)+(D15)))+(D11)))+((((A4)+((A15)+(D15)))+(((A8)+((A12)+(D12)))+(D8)))+(D4)))+(D0)),
BIT 1=((((A1)+((A12)+(D12)))+(((A5)+(((A9)+((A13)+(D13)))+(D9)))+(D5)))+(D1)),
BIT 2=((((A2)+((A13)+(D13)))+(((A6)+(((A10)+((A14)+(D14)))+(D10)))+(D6)))+(D2)),
BIT 3=((((A3)+((A14)+(D14)))+(((A7)+(((A11)+((A15)+(D15)))+(D11)))+(D7)))+(D3)),
BIT 4=((((A4)+((A15)+(D15)))+(((A8)+((A12)+(D12)))+(D8)))+(D4)),
BIT 5=((((A5)+(((A9)+((A13)+(D13)))+(D9)))+(D5))+((((A0)+(((A11)+((A15)+(D15)))+(D11)))+((((A4)+((A15)+(D15)))+(((A8)+((A12)+(D12)))+(D8)))+(D4)))+(D0))),
BIT 6 =((((A6)+(((A10)+((A14)+(D14)))+(D10)))+(D6))+((((A1)+((A12)+(D12)))+(((A5)+(((A9)+((A13)+(D13)))+(D9)))+(D5)))+(D1))),
BIT 7=((((A7)+(((A11)+((A15)+(D15)))+(D11)))+(D7))+((((A2)+((A13)+(D13)))+(((A6)+(((A10)+((A14)+(D14)))+(D10)))+(D6)))+(D2))),
BIT 8=((((A8)+((A12)+(D12)))+(D8))+((((A3)+((A14)+(D14)))+(((A7)+(((A11)+((A15)+(D15)))+(D11)))+(D7)))+(D3))),
BIT 9=((((A9)+((A13)+(D13)))+(D9))+((((A4)+((A15)+(D15)))+(((A8)+((A12)+(D12)))+(D8)))+(D4))),
BIT 10=((((A10)+((A14)+(D14)))+(D10))+(((A5)+(((A9)+((A13)+(D13)))+(D9)))+(D5))),
BIT 11=((((A11)+((A15)+(D15)))+(D11))+(((A6)+(((A10)+((A14)+(D14)))+(D10)))+(D6))),
BIT 12=((((A12)+(D12))+(((A7)+(((A11)+((A15)+(D15)))+(D11)))+(D7)))+((((A0)+(((A11)+((A15)+(D15)))+(D11)))+((((A4)+((A15)+(D15)))+(((A8)+((A12)+(D12)))+(D8)))+(D4)))+(D0))),
BIT 13=((((A13)+(D13))+(((A8)+((A12)+(D12)))+(D8)))+((((A1)+((A12)+(D12)))+(((A5)+(((A9)+((A13)+(D13)))+(D9)))+(D5)))+(D1))),
BIT 14=((((A14)+(D14))+(((A9)+((A13)+(D13)))+(D9)))+((((A2)+((A13)+(D13)))+(((A6)+(((A10)+((A14)+(D14)))+(D10)))+(D6)))+(D2))),
BIT 15=((((A15)+(D15))+(((A10)+((A14)+(D14)))+(D10)))+((((A3)+((A14)+(D14)))+(((A7)+(((A11)+((A15)+(D15)))+(D11)))+(D7)))+(D3)));

and (e) generating a clock pulse to provide synchronous timing; and
(f) appending said first n bit CRC word calculated by said combinational logic circuit to the end of said message to form a frame check sequence.

38. The method of generating a cyclic redundancy code word according to claim 37, wherein the step of calculating said first n bit CRC word utilizes a set of carry look-ahead equations to perform a numeric division operation on said parallel data words, said carry look-ahead equations implementing a preselected CRC polynomial.

39. The method of generating a cyclic redundancy code word according to claim 38, wherein said calculating step further includes calculating each bit of said first n bit CRC word simultaneously in parallel format.

40. The method of generating a cyclic redundancy code word according to claim 38, wherein the preselected CRC polynomial is:

$$F(X) = X^{16} + X^{12} + X^5 + 1$$

41. The method of generating a cyclic redundancy code word according to claim 37, wherein the step of transmitting said n bit data words further includes and uses a parallel-to-serial shift register responsive to said clock pulse to convert a plurality of n bit parallel format data words supplied by a message generation means into serial format for transmission over a serial data line.

42. The method of generating a cyclic redundancy code word according to claim 37, wherein the step of shifting said plurality of n bit data words into said combinational logic circuit further includes and uses a parallel-to-parallel shift register responsive to said clock pulse to shift a plurality of n bit parallel format data words supplied by a message generation means to said combinational logic circuit.

43. The method of generating a cyclic redundancy code word according to claim 37, wherein the step of shifting parallel format output from said combinational logic circuit back to said combinational logic circuit further includes and uses a parallel-to-parallel and parallel-to-serial shift register responsive to said clock pulse to shift output from said combinational logic circuit back to said combinational logic circuit in parallel format for a predetermined number of shifts and then converting said parallel format output from said combinational logic circuit to serial format to form said first CRC word which is then appended to end of said message for transmission.

44. A method of detecting errors which occur in the transmission of telecommunications data wherein said data includes a check frame sequence having a plurality of n bit data words, wherein each n bit data word has bits denoted as $D_0$ through $D_{n-1}$, and a first CRC word, said method comprising:

(a) converting a serial format received from check sequence into a plurality of n bit parallel format words;

(b) shifting n bit parallel format words into a combinational logic circuit;

(c) shifting parallel format output from said combinational logic circuit back, into said combinational logic circuit simultaneously with the shifting step of step (b), said parallel format output comprising n bits;

(d) calculating a second CRC word utilizing said combination logic circuit, said combinational logic circuit calculating a plurality of sequential intermediate n bit CRC words in parallel format during data reception wherein each bit of each intermediate CRC word is calculated simultaneously as a sum of the data word and the prior intermediate CRC word, having n bits denoted as $A_0$ through $A_{n-1}$, said combinational logic circuit implementing a plurality of carry look-ahead equations in which:

BIT 0 = ((((A0)+(((A11)+((A15)+(D15)))+(D11))))+ ((((A4)+((A15)+(D15)))+(((A8)+((A12)+(D12)))+(D8)))+(D4)))+(D0)),
BIT 1 = ((((A1)+((A12)+(D12)))+(((A5)+(((A9)+((A13)+(D13)))+(D9)))+(D5)))+(D1)),
BIT 2 = ((((A2)+((A13)+(D13)))+(((A6)+(((A10)+((A14)+(D14)))+(D10)))+(D6)))+(D2)),
BIT 3 = ((((A3)+((A14)+(D14)))+(((A7)+(((A11)+((A15)+(D15)))+(D11)))+(D7)))+(D3)),
BIT 4 = ((((A4)+((A15)+(D15)))+(((A8)+((A12)+(D12)))+(D8)))+(D4)),
BIT 5 = ((((A5)+(((A9)+((A13)+(D13)))+(D9)))+(D5))+ ((((A0)+(((A11)+((A15)+(D15)))+(D11)))+(((A4)+((A15)+(D15)))+(((A8)+((A12)+(D12)))+(D8)))+(D4)))+(D0))),
BIT 6 = ((((A6)+(((A10)+((A14)+(D14)))+(D10)))+(D6))+ ((((A1)+((A12)+(D12)))+(((A5)+(((A9)+((A13)+(D13)))+(D9)))+(D5)))+(D1))),
BIT 7 = ((((A7)+(((A11)+((A15)+(D15)))+(D11)))+(D7))+ ((((A2)+((A13)+(D13)))+(((A6)+(((A10)+((A14)+(D14)))+(D10)))+(D6)))+(D2))),
BIT 8 = ((((A8)+((A12)+(D12)))+(D8))+((((A3)+((A14)+(D14)))+(((A7)+(((A11)+((A15)+(D15)))+(D11)))+(D7)))+(D3))),
BIT 9 = ((((A9)+((A13)+(D13)))+(D9))+((((A4)+((A15)+(D15)))+(((A8)+((A12)+(D12)))+(D8)))+(D4))),
BIT 10 = ((((A10)+((A14)+(D14)))+(D10))+(((A5)+(((A9)+((A13)+(D13)))+(D9)))+(D5))),
BIT 11 = ((((A11)+((A15)+(D15)))+(D11))+(((A6)+(((A10)+((A14)+(D14)))+(D10)))+(D6))),
BIT 12 = ((((A12)+(D12))+(((A7)+(((A11)+((A15)+(D15)))+(D11)))+(D7))+((((A0)+(((A11)+((A15)+(D15)))+(D11)))+((((A4)+((A15)+(D15)))+(((A8)+((A12)+(D12)))+(D8)))+(D4)))+(D0))),
BIT 13 = ((((A13)+(D13))+(((A8)+((A12)+(D12)))+(D8)))+ ((((A1)+((A12)+(D12)))+(((A5)+(((A9)+((A13)+(D13)))+(D9)))+(D5)))+(D1))),
BIT 14 = ((((A14)+(D14))+(((A9)+((A13)+(D13)))+(D9)))+ ((((A2)+((A13)+(D13)))+(((A6)+(((A10)+((A14)+(D14)))+(D10)))+(D6)))+(D2))),
BIT 15 = ((((A15)+(D15))+(((A10)+((A14)+(D14)))+(D10)))+ ((((A3)+((A14)+(D14)))+(((A7)+(((A11)+((A15)+(D15)))+(D11)))+(D7)))+(D3)));

and (e) comparing the second CRC word with the first CRC word to detect errors that occured in transmission.

45. The method of detecting a errors according to claim 44, wherein the steps of calculating said second CRC word uses a set of carry look-ahead equations to perform a numeric division operation on said frame check sequence, said carry look-ahead equations utilizing a preselected CRC polynomial.

46. The method of detecting errors according to claim 45, wherein said calculating step further includes the step of calculating each bit of said second n bit CRC word simultaneously in parallel format.

47. The method of detecting errors according to claim 45, wherein said preselected CRC polynomial is:

$$F(X) = X^{16} + X^{12} + X^5 + 1$$

48. The method of detecting errors according to claim 44, wherein the step of converting a serial format received frame check sequence into a plurality of n bit parallel format words includes and uses a serial-to-parallel shift register responsive to a clock pulse to convert said serial format frame check sequence supplied by a serial data line into parallel format.

49. The method of detecting errors according to claim 48, wherein the step of shifting n bit parallel format words into said combinational logic circuit step further includes and uses a parallel-to-parallel shift register responsive to said clock pulse to shift said n bit parallel format words received from said serial-to-parallel shift register to said combinational logic circuit.

50. The method of detecting errors according to claim 44, wherein the step of shifting parallel format output from said combinational logic circuit back to said combinational logic circuit step comprises a parallel-to-parallel shift register responsive to a clock pulse to shift output from said combinational logic circuit back into said combinational logic circuit in parallel format.

51. The method of detecting errors according to claim 44, wherein the step of comparing the CRC words and detecting errors further includes the use of a flip-flop circuit to detect errors in said transmitted data.

52. The method of detecting errors according to claim 51, wherein said step of detecting errors further includes the step of setting a flag to indicate a need to retransmit upon detection of an error in said frame check sequence.

* * * * *

UNITED STATES PATENT AND TRADEMARK OFFICE
CERTIFICATE OF CORRECTION

PATENT NO. : 5,132,975

DATED : July 21, 1992

INVENTOR(S) : Napoleon G. Avaneas

It is certified that error appears in the above-identified patent and that said Letters Patent is hereby corrected as shown below:

In the Abstract, line 10: "at the transmitter" should read as --at transmitter--

Column 10, line 52: "to" should read as --in--

Column 15, line 33, Claim 1: "((A.14)" should read as --((A14)--

Column 17, lines 20-21, Claim 10: "parallel" should read as --parallel converter,--

Column 17, line 40, Claim 13: "claim" should read as --claim 1--

Column 17, lines 46 & 49, Claim 14: "combination" should read as --combinational--

Column 17, line 56, Claim 14: "words" should read as --word--

Column 18, line 45, Claim 14: "((A.14)" should read as --((A14)--

UNITED STATES PATENT AND TRADEMARK OFFICE
CERTIFICATE OF CORRECTION

PATENT NO. : 5,132,975

DATED : July 21, 1992

INVENTOR(S) : Napoleon G. Avaneas

It is certified that error appears in the above-identified patent and that said Letters Patent is hereby corrected as shown below:

Column 20, line 37, Claim 25: "combination" should read as --combinational--

Column 23, line 15, Claim 44: "back," should read as --back--

Column 23, line 20, Claim 44: "combination" should read as --combinational--

Signed and Sealed this

Ninth Day of November, 1993

Attest:

BRUCE LEHMAN

Attesting Officer

Commissioner of Patents and Trademarks